United States Patent
Ku

(10) Patent No.: US 9,324,400 B2
(45) Date of Patent: Apr. 26, 2016

(54) SEMICONDUCTOR MEMORY DEVICE AND SEMICONDUCTOR MEMORY SYSTEM

(71) Applicant: SK hynix Inc., Gyeonggi-do (KR)

(72) Inventor: Kie-Bong Ku, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/296,102

(22) Filed: Jun. 4, 2014

(65) Prior Publication Data

US 2015/0155016 A1    Jun. 4, 2015

(30) Foreign Application Priority Data

Dec. 4, 2013    (KR) .......................... 10-2013-0149909

(51) Int. Cl.

| G11C 11/41 | (2006.01) |
| G11C 8/12 | (2006.01) |
| G11C 5/02 | (2006.01) |
| G11C 7/02 | (2006.01) |
| G11C 11/4099 | (2006.01) |
| G11C 7/14 | (2006.01) |

(52) U.S. Cl.
CPC ........ *G11C 8/12* (2013.01); *G11C 5/025* (2013.01); *G11C 7/02* (2013.01); *G11C 7/14* (2013.01); *G11C 11/4099* (2013.01)

(58) Field of Classification Search
CPC .................................. G11C 11/41; G11C 7/12
USPC ..................................... 365/203, 201
See application file for complete search history.

(56) References Cited

U.S. PATENT DOCUMENTS

| 8,000,123 B2 * | 8/2011 | Okahiro et al. ................ 365/63 |
| 2008/0266928 A1 * | 10/2008 | Shinozaki et al. ............. 365/72 |
| 2011/0260224 A1 * | 10/2011 | Hidaka ........................ 257/295 |

FOREIGN PATENT DOCUMENTS

KR    1020070098039    10/2007

* cited by examiner

*Primary Examiner* — Michael Tran
(74) *Attorney, Agent, or Firm* — IP & T Group LLP

(57) ABSTRACT

A semiconductor memory device includes a unit memory bank having a plurality of memory cell mats, which shares a local data line, and divided by a row address; and at least one dummy cell mat disposed between the plurality of memory cell mat.

14 Claims, 5 Drawing Sheets

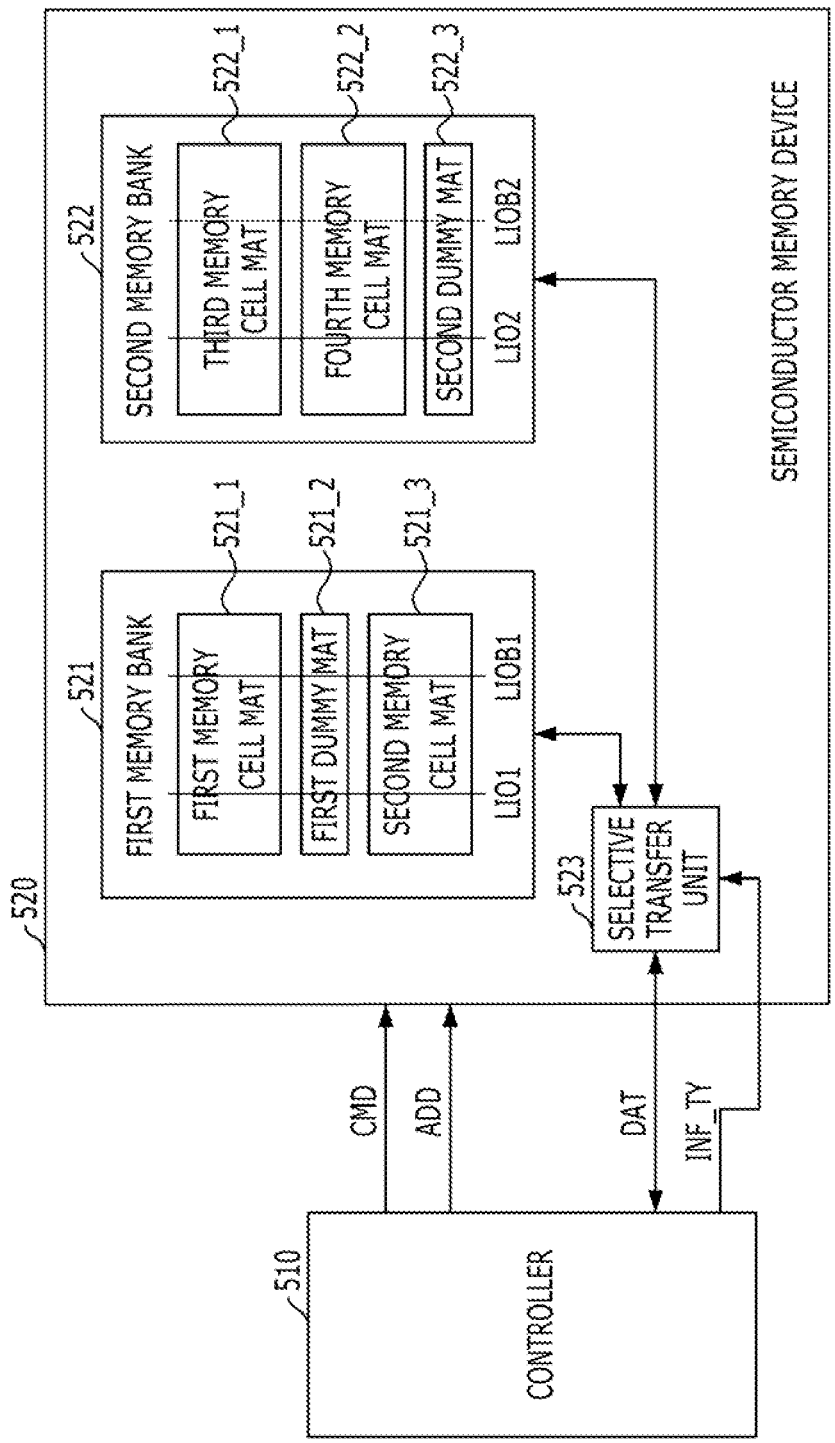

SEMICONDUCTOR MEMORY DEVICE AND SEMICONDUCTOR MEMORY SYSTEM

CROSS-REFERENCE TO RELATED APPLICATIONS

The present application claims priority to Korean Patent Application No. 10-2013-0149909 filed on Dec. 4, 2013, which is incorporated by reference herein in its entirety.

BACKGROUND

1. Field

Exemplary embodiments of the present invention relate to a semiconductor design technology, and more particularly, to a semiconductor memory device having an open bit line structure and a semiconductor memory system including the same.

2. Description of the Related Art

In general, a semiconductor memory device such s a double data rater synchronous dynamic random access memory (DDR SDRAM) includes a memory bank for storing large amounts of data. The memory bank is an aggregation of a plurality of unit memory cells that store data. Each of the unit memory cells is coupled to a corresponding bit line for transferring data in units of a bit. A bank structure of the semiconductor memory device is classified into a folded bit line structure and an open bit line structure, according to a structure in which a bit line is disposed.

In the folded bit line structure, a data bit line and a reference bit line are disposed in the same memory cell mat according to a sense amplifier which is disposed in a memory area of the semiconductor memory device. The cell mat denotes a unit of memory mats included in a memory bank of a semiconductor memory device. The data bit line is a bit line in which a data stored in a memory cell is substantially transferred, and the reference bit line is a bit line having a reference value which is compared with a value of the data transferred from the data bit line. In the open bit line structure, a data bit line and a reference bit line are disposed in a different memory cell mat according to a sense amplifier.

As described above, since the folded bit line structure has the data bit line and the reference bit line disposed in the same memory cell mat, the same noises are reflected on the data bit line and the reference bit line. Accordingly, the noise reflected on the data bit line and the noise reflected on the reference bit line cancel each other out, and thus the folded bit line structure has an excellent characteristic for noise cancellation in comparison with the open bit line structure.

Since the open bit line structure has the data bit line and the reference bit line disposed in the different memory cell mat, the noise reflected on the data bit line is different from the noise reflected on the reference bit line. Accordingly, the open bit line structure has a poor characteristic for noise cancellation in comparison with the folded bit line structure.

Furthermore, an area of a unit memory cell in the folded bit line structure is different from that in the open bit line structure. The unit memory cell in the folded bit line structure is designed to have $8F^2$ while the unit memory cell in the open bit line structure is designed to have $6F^2$. This means that a memory bank having an open bit line structure may be designed to occupy an area smaller than a memory bank having a folded bit line structure when the same number of data is stored. That is, in a view of area the open bit line structure is more beneficial than the folded bit line structure.

FIG. 1 is a block diagram illustrating a typical semiconductor memory device having an open bit line structure. For reference, FIG. 1 shows a configuration corresponding to one unit memory bank which includes memory cell mats corresponding to a pair of local data lines LIO and LIOB and sense amplifiers.

Referring to FIG. 1, the semiconductor memory device has a plurality of memory cell mats 110, 130, 150, . . . , 160 and 180, and a plurality of sense amplifiers 120, 140, . . . , and 170. A unit memory bank composed of 64 memory cell mats is described as an example. The semiconductor memory device is composed of first to 64th memory cell mats 110, 130, 150, . . . , 160 and 180, and first and 63th sense amplifiers 120, 140, . . . , and 170 are disposed therebetween.

When the semiconductor memory device has the open bit line structure, each sense amplifier receives a data of a data bit line from one of two adjacent memory cell mats and a data of a reference bit line from the other of two adjacent memory cell mats, and amplifies the data of the data bit line and the data of the reference bit line. Each sense amplifier outputs an amplification result to the pair of local data lines LIO and LIOB in response to a column selection signal YI. For reference, the above described operation corresponds to a typical read operation. In a write operation, data loaded on the pair of local data lines LIO and LIOB are transferred to the respective memory cell mats in response to the column selection signal YI, and stored therein.

Hereinafter, a simple write operation will be described in detail. For convenience of description, it is assumed that a second write operation of the second memory cell mat 130 is consecutively performed after a first write operation of the first memory cell mat 110 has been performed.

During the first write operation of the first memory cell mat 110, a first word line WL1 corresponding to the first memory cell mat 110 is activated. Then, data to be stored in the first memory cell mat 110 are transferred to the first sense amplifier 120 through the pair of local data lines LIO and LIOB, and amplified and stored in the first memory cell mat 110 through the first sense amplifier 120. In detail, the first sense amplifier 120 selectively couples the pair of local data lines LIO and LIOB to a data bit line (not shown) disposed in the first memory cell mat 110 and a reference bit line (not shown) disposed in the second memory cell mat 130 in response to the column selection signal YI. Accordingly, the data transferred from the pair of local data lines LIO and LIOB are stored in the first memory cell mat 110 through the data bit line.

Subsequently, during the second write operation of the second memory cell mat 130, a second word line WL2 corresponding to the second memory cell mat 130 is activated. Then, data to be stored in the second memory cell mat 130 are transferred to the first sense amplifier 120 through the pair of local data lines LIO and LIOB, and amplified and stored in the second memory cell mat 130 through the first sense amplifier 120.

The semiconductor memory device is generally designed to operate according to a preset specification (SPEC.). In such a preset specification, a write recovery time 'tWR' is defined as a time until a precharge command is applied after data are applied according to a write operation. The write recovery time 'tWR' is used as a reference for determining an interval between two consecutive write commands.

In the above write operations as described the second write operation of the second memory cell mat 130 is performed after the first write operation of the first memory cell mat 110 is performed. However, after the first write operation of the first memory cell mat 110 is performed, a precharge operation is substantially performed before the second write operation of the second memory cell mat 130 is performed. The write recovery time 'tWR' is a time until a precharge command for the precharge operation is applied, after data are applied according to the first write operation of the first memory cell mat 110.

FIG. 2 is a timing diagram illustrating the write recovery time 'tWR'.

Referring to FIGS. 1 and 2, the first write operation of the first memory cell mat 110 and the second write operation of the second memory cell mat 130 are described in detail.

As illustrated in FIGS. 1 and 2, an external controller (not shown) sends an active command ACT #1 and a write command WT for the first write operation of the first memory cell mat 110 to the semiconductor memory device, and transmits data DAT to be written in the first memory cell mat 110. The data DAT are transferred and stored in the first memory cell mat 110 through the pair of local data lines LIO and LIOB.

The data bit line and the reference bit line of the first and second memory cell mats 110 and 130 are precharged to a given voltage level in response to a precharge command PCG. The write recovery time 'tWR' may be defined as a time until the precharge command PCG is applied, after the data DAT are inputted according to the first write operation of the first memory cell mat 110. The second write operation of the second memory cell mat 130 may be performed after the data bit line and the reference bit line of the first and second memory cell mats 110 and 130 are precharged. That is, the second write operation of the second memory cell mat 130 may be performed at least when the write recovery time 'tWR' is available after the first write operation of the first memory cell mat 110 has been performed.

Following the first write operation of the first memory cell mat 110 being performed, the second write operation of the second memory cell mat 130 is performed after the write recovery time 'tWR' from the first write operation of the first memory cell mat 110. Such a write operation may be applied to all memory cell mats. That is, in case of a semiconductor memory device having an open bit line structure, at least a time corresponding to the write recovery time 'tWR' has to be available between consecutive write operations when the consecutive write operations are performed on adjacent memory cell mats included in a unit memory bank.

SUMMARY

Various exemplary embodiments of the present invention are directed to a semiconductor memory device capable of minimizing a time for performing consecutive access operations on adjacent memory cell mats by modifying a mat structure of a unit memory bank.

In accordance with an exemplary embodiment of the present invention, a semiconductor memory device may include: a unit memory bank having a plurality of memory cell mats, which shares a local data line, and divided by a row address; and at least one dummy cell mat disposed between the plurality of memory cell mats.

The dummy cell mat may comprise reference bit lines corresponding to reference bit lines of memory cell mats disposed adjacent to the dummy cell mat.

In accordance with another exemplary embodiment of the present invention, a semiconductor memory system may include: a semiconductor memory device having an open bit line structure; and a controller suitable for controlling the semiconductor memory device, wherein the controller transmits, to the semiconductor memory device, data with a first data type and data with a second data type having an interval between consecutive write operations which is different from that of the first data type, and wherein the semiconductor memory device comprises: a first memory bank that includes first and second memory cell mats suitable for sharing a first local data line, and a first dummy cell mat disposed between the first and second memory cell mats; a second memory bank that includes third and fourth memory cell mats suitable for sharing a second local data line, and a second dummy cell mat disposed in an edge of the second memory bank; and a selective transfer unit suitable for selectively transferring the data transferred from the controller to the first memory bank or the second memory bank based on the data type.

The data having the first data type may include an interval between consecutive write operations that is shorter than the data having the second data type.

According to embodiments of the present invention, a time for performing consecutive access operations on adjacent memory cell mats may be minimized by modifying a mat structure of a unit memory bank having an open bit line structure, so that it is possible to enhance an overall operating speed of the semiconductor memory device.

BRIEF DESCRIPTION OF THE DRAWINGS

FIG. 5 is a block diagram illustrating a semiconductor memory system in accordance with an exemplary embodiment of the present invention.

DETAILED DESCRIPTION

Figure 1:
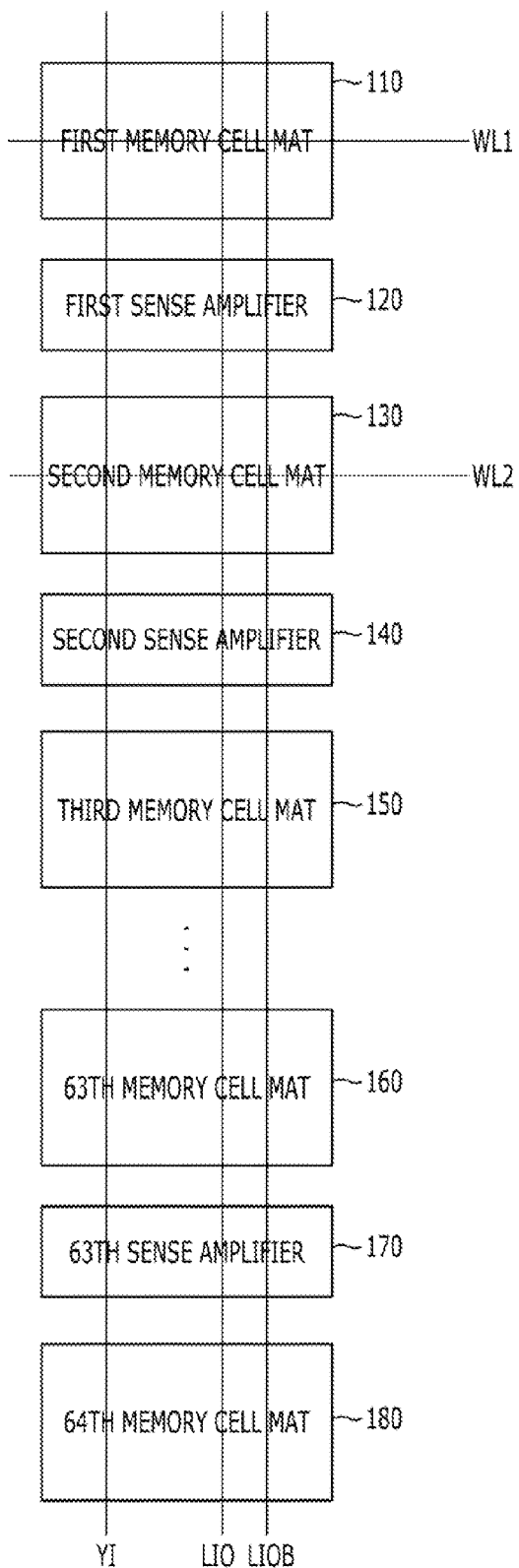
FIG. 1 is a block diagram illustrating a semiconductor memory device having an open bit line structure.
Figure 2:
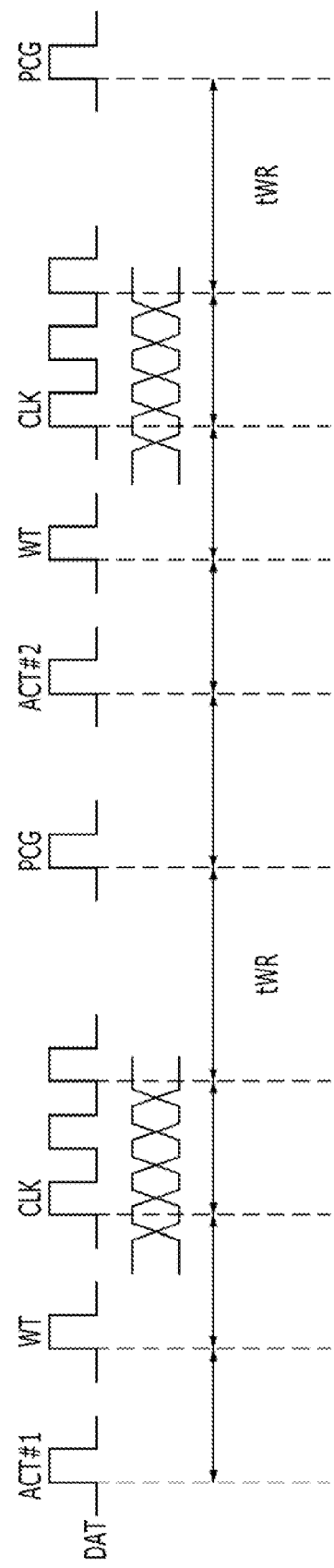
FIG. 2 is a timing diagram illustrating a write recovery time 'tWR'.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The drawings are not necessarily to scale and in some instances, proportions may have been exaggerated to clearly illustrate features of the embodiments. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
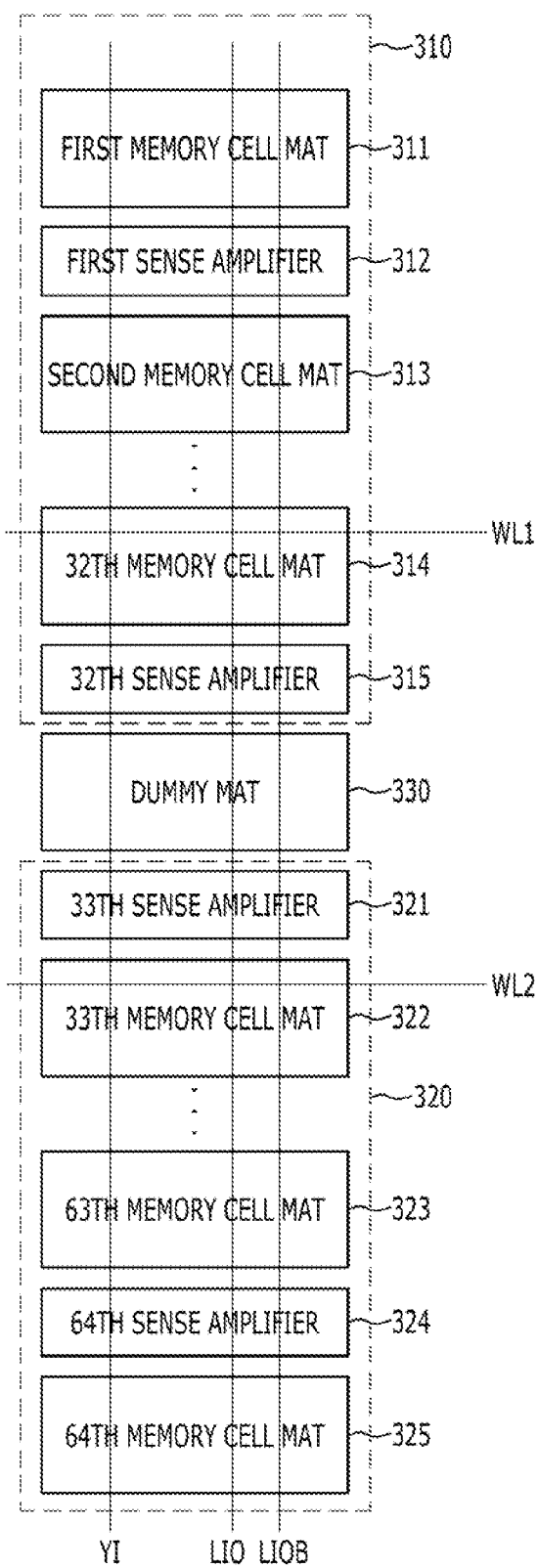
FIG. 3 is a block diagram illustrating a semiconductor memory device having an open bit line structure in accordance with an exemplary embodiment of the present invention.

FIG. 3 is a block diagram illustrating a semiconductor memory device having an open bit line structure in accordance with an exemplary embodiment of the present invention.

Referring to FIG. 3 which shows a configuration corresponding to a unit memory bank that includes memory cell mats corresponding to a pair of local data lines LIO and LIOB and sense amplifiers. In accordance with the exemplary embodiment of the present invention, the semiconductor memory device includes a dummy mat which is provided between the memory cell mats in the unit memory bank.

As illustrated in FIG. 3, the semiconductor memory device includes an upper bank region 310, a lower bank region 320 and a dummy mat 330. The upper bank region 310 denotes a region that memory cell mats and sense amplifiers are disposed in, relative to the dummy mat 330. The lower bank region 320 denotes a region that memory cell mats and sense amplifiers are disposed in, relative to the dummy mat 330.

The upper bank region 310 includes first to 32th Memory cell mats 311, 313, ..., and 314, and first to 32th sense amplifiers 312, ..., and 315. The first sense amplifier 312 performs a data amplification operation on the first memory cell mat 311 and the second memory cell mat 313, and the 32th sense amplifier 315 performs a data amplification operation on the 32th memory cell mat 314 and the dummy mat 330. Each memory cell mat in the upper bank region 310 may be divided by a row address.

The lower bank region 320 includes 33th to 64th memory cell mats 322, 323, ..., and 325, and 33th to 64th sense amplifiers 321, ..., and 324. The 33th sense amplifier 321 performs a data amplification operation on the dummy mat 330 and the 33th memory cell mat 322, and the 64th sense amplifier 324 performs a data amplification operation on the 63th memory cell mat 323 and the 64th memory cell mat 325.

The dummy mat 330 is disposed between the 32th memory cell mat 314 and the 33th memory cell mat 322, and includes a reference bit line (not shown) corresponding to a reference bit line of the 32th memory cell mat 314, and a reference bit line (not shown) corresponding to a reference bit line of the 33th memory cell mat 322.

Hereinafter, a write operation of the semiconductor memory device shown in FIG. 3 will be described. For convenience of description, it is presumed that a write operation of the 33th memory cell mat 322 is performed after a write operation of the 32th memory cell mat 314 is performed.

During the write operation of the 32th memory cell mat 314, a first word line WL1 corresponding to the 32th memory cell mat 314 is activated. The data to be stored in the 32th memory cell mat 314 are transferred to the 32th sense amplifier 315 through the pair of local data lines LIO and LIOB, and amplified and stored in the 32th memory cell mat 314 through the 32th sense amplifier 315. The 32th sense amplifier 315 selectively couples the pair of local data lines LIO and LIOB to a data bit line (not shown) disposed in the 32th memory cell mat 314 and the reference bit line (not shown) disposed in the dummy mat 330 in response to a column selection signal YI. Accordingly, the data transferred from the pair of local data lines LIO and LIOB are stored in the 32th memory cell mat 314 through the data bit line.

Subsequently, during the write operation of the 33th memory cell mat 322, a second word line WL2 corresponding to the 33th memory cell mat 322 is activated. Then, data to be stored in the 33th memory cell mat 322 are transferred to the 33th sense amplifier 321 through the pair of local data lines LIO and LIOB. Here, the 33th sense amplifier 321 selectively couples the pair of local data lines LIO and LIOB to a data bit line (not shown) disposed in the 33th memory cell mat 322 and the reference bit line (not shown) disposed in the dummy mat 330 in response to the column selection signal YI. Accordingly, the data transferred from the pair of local data lines LIO and LIOB are stored in the 33th memory cell mat 322 through the data bit line.

The semiconductor memory device in accordance with the exemplary embodiment of the present invention includes the dummy mat 330 disposed between the memory cell mats in the unit memory bank sharing the pair of local data lines LIO and LIOB. Therefore, the semiconductor memory device in accordance with the exemplary embodiment of the present invention may overcome the limitations of an operation regarding a write recovery time 'tWR'.

Figure 4:
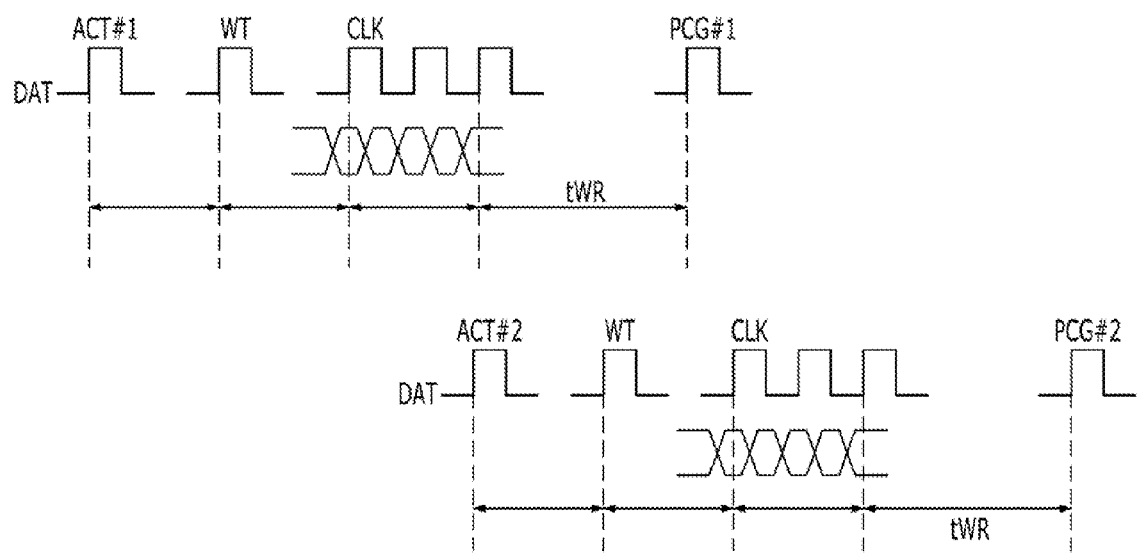
FIG. 4 is a timing diagram illustrating an operation of the semiconductor memory device shown in FIG. 3.

FIG. 4 is a timing diagram illustrating an operation of the semiconductor memory device shown in FIG. 3.

Referring to FIGS. 3 and 4, consecutive write operations of the 32th memory cell mat 314 and the 33th memory cell mat 322, which are disposed adjacent to the dummy mat 330, will now be described.

An external controller (not shown) sends an active command ACT #1 and a write command WT for the write operation of the 32th memory cell mat 314 to the semiconductor memory device, and transmits data DAT to be written in the 32th memory cell mat 314. The data DAT are transferred and stored in the 32th memory cell mat 314 through the pair of local data lines LIO and LIOB. Thereafter, the data bit line of the 32th memory cell mat 314 and the reference bit line of the dummy mat 330 are precharged to a given voltage level in response to a precharge command PCG #1 for a precharge operation of the 32th memory cell mat 314 and the dummy mat 330.

As described in FIG. 3, the dummy mat 330 includes the reference bit lines corresponding to the 32th memory cell mat 314 and the 33th memory cell mat 322, which are disposed adjacent to the dummy mat 330. The reference bit line corresponding to the 32th memory cell mat 314 and the reference bit line corresponding to the 33th memory cell mat 322 are disposed to be isolated from each other. Accordingly, after the write operation of the 32th memory cell mat 314 is performed, the write operation of the 33th memory cell mat 322 may be performed before the precharge command PCG #1 for the precharge operation of the 32th memory cell mat 314 is applied. That is, since the reference bit line of the dummy mat 330 corresponding to the 33th memory cell mat 322 has been precharged when the 33th memory cell mat 322 performs the write operation, the write operation of the 33th memory cell mat 322 may be performed even though the write recovery time 'tWR' to the 32th memory cell mat 314 is not available. Accordingly, it is possible to overcome the limitations of the write recovery time 'tWR'.

As described above, the semiconductor memory device in accordance with the exemplary embodiment of the present invention may overcome the limitations of the write recovery time 'tWR' during consecutive write operations on adjacent memory cell mats. Through this, a faster write operation of the semiconductor memory device may be realized.

FIG. 5 is a block diagram illustrating a semiconductor memory system in accordance with an exemplary embodiment of the present invention.

Referring to FIG. 5, the semiconductor memory system includes a controller 510 and a semiconductor memory device 520.

The controller 510 controls the semiconductor memory device 520 and provides a command signal CMD an address signal ADD, and data DAT to the semiconductor memory device 520. The command signal CMD defines an active operation and the like, such as a write operation and a read operation of the semiconductor memory device 520. The address signal ADD indicates locations of data to be read or written, from or to the semiconductor memory device 520.

In the semiconductor memory system in accordance with the exemplary embodiment of the present invention the controller 510 transmits the data DAT having intervals between consecutive write operations that are different from each other, to the semiconductor memory device 520. The interval between consecutive write operations indicates a time from when a write command for a write operation on a predetermined memory bank is applied, to when a write command for a next write operation on the predetermined memory bank is consecutively applied. That is, the controller 510 transmits the data DAT having two different types of intervals between consecutive write operations to the semiconductor memory device 520. For convenience of description, data having a shorter interval between consecutive write operations are defined as the data having a "first data type", and data having a longer interval between consecutive write operations are defined as the data having a "second data type". The data DAT having the first data type are transferred and stored in a first memory bank 521 which may perform a write operation faster than a second memory bank 522, and the data DAT having the second data type are transferred and stored in the second memory bank 522 which may perform a write operation slower than the first memory bank 521.

The semiconductor memory device 520 includes the first memory bank 521, the second memory bank 522, and a selective transfer unit 523.

The first memory bank 521 has a configuration corresponding to the unit memory bank of FIG. 3, and includes first and second memory cell mats 521_1 and 521_3, and a first dummy mat 521_2 disposed therebetween. The second memory bank 522 includes third and fourth memory cell mats 522_1 and 522_2, and a second dummy mat 522_3 disposed in an edge of the second memory bank 522. The first and second memory cell mats 521_1 and 521_3 and the first dummy mat 521_2 of the first memory bank 521 share a pair of first local data lines LIO1 and LIOB1. The third and fourth memory cell mats 522_1 and 522_2 and the second dummy mat 522_3 of the second memory bank 522 share a pair of second local data lines LIO2 local data lines LIO2 and LIOB2.

The selective transfer unit 523 selectively transfers the data DAT from the controller 510 to the first memory bank 521 or the second memory bank 522 in response to a data type information INF_TY. The data type information INF_TY includes information on an interval between consecutive write operations on the data DAT. That is, the data type information INF_TY indicates whether the data DAT correspond to the first data type or the second data type. The selective transfer unit 523 transfers the data DAT to the first memory bank 521 when the data DAT correspond to the first data type having the longer interval between the consecutive write operations, and transfers the data DAT to the second memory bank 522 when the data DAT correspond to the second data type having the shorter interval between the consecutive write operations.

Hereinafter, an operation of the semiconductor memory system will be described in detail.

When the data DAT having the first data type are inputted, the controller 510 provides the data type information INF_TY indicating a shorter interval between consecutive write operations to the semiconductor memory device 520. The selective transfer unit 523 of the semiconductor memory device 520 transfers the data DAT to the first memory bank 521 in response to the data type information INF_TY. As described in FIGS. 3 and 4, during consecutive write operations on adjacent memory cell mats, a write operation on the next memory cell mat may be performed even though the write recovery time 'tWR' to the previous memory cell mat is not available. Therefore, the first memory bank 521 may perform a faster write operation.

When the data DAT having the second data type are inputted, the controller 510 provides the data type information INF_TY indicating a longer interval between consecutive write operations to the semiconductor memory device 520. The selective transfer unit 523 of the semiconductor memory device 520 transfers the data DAT to the second memory bank 522 in response to the data type information INF_TY. For reference, the second memory bank 522 has to perform a precharge operation after a write operation of the third memory cell mat 522_1 is performed, and a write operation of the fourth memory cell mat 522_2 will be performed when the write recovery time 'tWR' is available after the write operation of the third memory cell mat 522_1 has been performed.

The semiconductor memory system in accordance with the exemplary embodiment of the present invention includes the first memory bank 521 and the second memory bank 522, which are able to store data having a different type of intervals between consecutive write operations by designing the first memory bank 521 and the second memory bank 522 to have a different structure from each other. Accordingly, the controller 510 may enhance an efficiency of a write operation on the data having a different type of intervals between consecutive write operations. This means that a time for performing the consecutive write operations may be minimized.

According to the exemplary embodiments of the present invention as described above, the semiconductor memory device may enhance an overall operating speed thereof by overcoming the limitations of the write recovery time 'tWR'. Further, according to the exemplary embodiments of the present invention as described above, the semiconductor memory system may enhance an efficiency of a write operation by optimizing the write operation depending on data having a different type of intervals between consecutive write operations.

While the present invention has been described with respect to the specific embodiments, it will be apparent to those skilled in the art that various changes and modifications may be made without departing from the spirit and scope of the invention as defined in the following claims.

Although the semiconductor memory system according to the exemplary embodiments of the present invention has been described with respect to a write operation, a semiconductor memory system according to an exemplary embodiment of the present invention may be applied to a read operation. For example, the selective transfer unit 523 of FIG. 5 forms a data transfer path between the first memory bank 521 and the controller 510, or a data transfer path between the second memory bank 522 and the controller 510 in response to the data type information INF_TY. In the read operation, the selective transfer unit 523 may selectively transfer data to the controller 510 from the first memory bank 521 or the second memory bank 522 through such a data transfer path. As a result, the semiconductor memory system may enhance an efficiency of a read operation by optimizing the read operation depending on data having a different type of intervals between consecutive read operations.

What is claimed is:

1. A semiconductor memory device having an open bit line structure, comprising:
   a unit memory bank having a plurality of memory cell mats, which shares a local data line, and divided by a row address; and
   at least one dummy cell mat disposed between the plurality of memory cell mats,
   wherein the dummy cell mat comprises reference bit lines corresponding to reference bit lines of the plurality of memory cell mats disposed adjacent to the dummy cell mat,
   wherein the reference bit lines of the dummy cell mat corresponding to the reference bit lines of the plurality of memory cell mats are disposed to be isolated from each other.

2. The semiconductor memory device of claim 1 wherein the unit memory bank comprises:
   first and second memory cell mats suitable for sharing the local data line; and
   the dummy cell mat disposed between the first and second memory cell mats.

3. The semiconductor memory device of claim 2, wherein the unit memory bank performs a row active operation on the first memory cell mat, performs a precharge operation on the first memory cell mat and the dummy cell mat, and performs a row active operation on the second memory cell mat before the precharge operation.

4. A semiconductor memory system comprising:
   a semiconductor memory device having an open bit line structure; and
   a controller suitable for controlling the semiconductor memory device,
   wherein the controller transmits, to the semiconductor memory device, data having a first data type and data having a second data type that has an interval between consecutive write operations, which is different from that of the first data type, and
   wherein the semiconductor memory device comprises:
   a first memory bank that includes first and second memory cell mats suitable for sharing a first local data line, and a first dummy cell mat disposed between the first and second memory cell mats;
   a second memory bank that includes third and fourth memory cell mats suitable for sharing a second local data line, and a second dummy cell mat disposed in an edge of the second memory bank; and
   a selective transfer unit suitable for selectively transferring the data transferred from the controller to the first memory bank or the second memory bank based on the data type.

5. The semiconductor memory system of claim 4, wherein the data having the first data type includes an interval between consecutive write operations that is shorter than that of the data having the second data type.

6. The semiconductor memory system of claim 4, wherein the first memory bank performs a write operation on the second memory cell mat before a precharge operation on the first memory cell mat after a write operation on the first memory cell mat.

7. The semiconductor memory system of claim 4, wherein the second memory bank performs a write operation on the fourth memory cell mat after a precharge operation on the third memory cell mat.

8. The semiconductor memory system of claim 4, wherein the interval between consecutive write operations is determined from when a write command for a first write operation on a predetermined memory bank is applied, to when a write command for a second write operation on the predetermined memory bank is consecutively applied.

9. The semiconductor memory system of claim 4, wherein the first dummy cell mat comprises reference bit lines corresponding to reference bit lines of the first and second memory cell mats.

10. The semiconductor memory system of claim 9, wherein the reference bit lines of the first dummy cell mat corresponding to the reference bit lines of the first and second memory cell mats are disposed to be isolated from each other.

11. A semiconductor memory device having an open bit line structure, comprising:
    a unit memory bank having a plurality of memory cell mats, which shares a local data line, and divided by a row address, wherein each of the memory cell mat includes cell mats and sense amplifiers; and
    at least one dummy cell mat disposed between the sense amplifiers included in the plurality of memory cell mat,
    wherein the unit memory bank comprises:
    first and second memory cell mats suitable for sharing the local data line; and
    the dummy cell mat disposed between the first and second memory cell mats.

12. The semiconductor memory device of claim 11, wherein the dummy cell mat comprises reference bit lines corresponding to reference bit lines of the plurality of memory cell mats disposed adjacent to the dummy cell mat.

13. The semiconductor memory device of claim 12, wherein the reference bit lines of the dummy cell mat corresponding to the reference bit lines of the plurality of memory cell mats are disposed to be isolated from each other.

14. The semiconductor memory device of claim 12, wherein the unit memory bank performs a row active operation on the first memory cell mat, performs a precharge operation on the first memory cell mat and the dummy cell mat, and performs a row active operation on the second memory cell mat before the precharge operation.

* * * * *